(12) United States Patent
Blom

(10) Patent No.: US 11,309,838 B2
(45) Date of Patent: *Apr. 19, 2022

(54) SELF-OSCILLATING SPREAD SPECTRUM FREQUENCY CONTROL LOOP

(71) Applicant: Littelfuse, Inc., Chicago, IL (US)

(72) Inventor: Eric D. Blom, Wakefield, MA (US)

(73) Assignee: Littelfuse, Inc., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/123,575

(22) Filed: Dec. 16, 2020

(65) Prior Publication Data

US 2021/0203276 A1 Jul. 1, 2021

Related U.S. Application Data

(63) Continuation of application No. 16/731,809, filed on Dec. 31, 2019, now Pat. No. 10,903,792.

(51) Int. Cl.
*H03B 23/00* (2006.01)
*H04L 25/02* (2006.01)

(52) U.S. Cl.
CPC ......... *H03B 23/00* (2013.01); *H04L 25/0268* (2013.01)

(58) Field of Classification Search
CPC .. H04L 25/0268; H04L 25/0266; H03B 23/00
See application file for complete search history.

(56) References Cited

U.S. PATENT DOCUMENTS

| 7,302,247 | B2 | 11/2007 | Dupuis |
| 7,558,311 | B2 | 7/2009 | Shin et al. |
| 9,660,848 | B2 | 5/2017 | Yun et al. |
| 10,903,792 | B1 * | 1/2021 | Blom ............... H03L 7/085 |
| 2004/0136440 | A1 | 7/2004 | Miyata et al. |
| 2015/0061736 | A1 | 3/2015 | Mai |
| 2019/0068410 | A1 | 2/2019 | Al-Shyoukh et al. |

FOREIGN PATENT DOCUMENTS

| EP | 1473861 A1 | 11/2004 |
| JP | 11074763 | 3/1999 |

\* cited by examiner

*Primary Examiner* — Ryan Johnson
(74) *Attorney, Agent, or Firm* — Kacvinsky Daisak Bluni PLLC

(57) ABSTRACT

A self-oscillating spread spectrum frequency control loop contains a gated voltage-controlled oscillator (VCO) which receives a digital signal that can start or stop its oscillation. The VCO generates a spread spectrum carrier by receiving a triangle wave signal from a delaying ramp generator in a loop, its ramp direction controlled by a frequency comparator. The loop generates a spectrum spread as wide as possible above a minimum frequency. RF isolators that utilize low-pass filters in the transmitter and high-pass filters in the receiver, where the F-3 dB cutoff frequencies of both filters vary in a correlated manner, are used to not produce spread spectrum frequencies below the minimum frequency. Die from a given wafer lot, when designed such that the low- and high-pass cutoff frequencies track, can be used to form RF digital isolators whose minimum spread spectrum frequency does not go below the minimum frequency required by that wafer lot.

19 Claims, 7 Drawing Sheets

US 11,309,838 B2

SELF-OSCILLATING SPREAD SPECTRUM FREQUENCY CONTROL LOOP

CROSS REFERENCE TO RELATED APPLICATION

This application is a continuation of, and claims the benefit of priority to, U.S. patent application Ser. No. 16/731,809, filed Dec. 31, 2019, entitled "SELF-OSCILLATING SPREAD SPECTRUM FREQUENCY CONTROL LOOP," which application is incorporated herein by reference in its entirety.

BACKGROUND

Digital isolators are circuits which provide digital communication across an isolation barrier. Digital isolators protect (usually low voltage) digital logic circuits from large common mode voltage differences and transients. For example, digital isolators allow the use of low voltage digital circuits to control the switching within a high voltage switching power supply. Digital isolators that send RF across the isolation barrier, also known as Radio Frequency (RF) isolators, send RF across a transformer or capacitive isolation barrier and detect the presence versus the absence of RF at the receiver as a binary digital logic value. RF isolators can be small in size, low in power, and cost effective while simultaneously communicating digital data at very high rates.

Products using RF isolators that are sold to consumers or industry must comply with Federal Communications Commission (FCC) part 15 limits on radiated RF emission. For the frequency band of 216 to 960 MHz, there should be no frequency with an RF field strength greater than 200 uV/meter when measured at a distance of 3 meters. It is often found that cables, long printed circuit board traces, and other wiring can form unintended antennas which cause excess radiated RF. In a system using RF digital isolators, such wiring could exist in the power and ground path at either side of the isolator. If a fixed frequency RF carrier is used, there can also be resonances at that frequency which can actually amplify emitted RF. It is thus beneficial for RF isolators to use spread spectrum RF, wherein the RF is not a single frequency but is spread out to multiple frequencies at lower amplitudes.

SUMMARY

In various embodiments, a self-oscillating spread spectrum frequency control loop is provided. The self-oscillating spread spectrum frequency control loop contains a gated voltage-controlled oscillator (VCO). Upon receiving a digital turn-on gate signal, the VCO generates a first frequency which continually decreases to a lower frequency. Upon reaching the desired lower frequency, the VCO output frequency then begins to continually increase. Upon reaching the desired upper frequency, the frequency begins to decrease again. The frequency "down-then-up" process is repeated for as long as the digital gate control signal is asserted. The VCO is able to generate the spread spectrum carrier by receiving a triangle wave signal into its $V_{control}$ input. The self-oscillating spread spectrum frequency control loop is suitable to be used within RF digital isolators, which benefit from transmitting and receiving a signal whose bandwidth is stretched as wide as possible or, in another embodiment, as wide as possible above a known minimum frequency.

DETAILED DESCRIPTION

A self-oscillating spread spectrum frequency control loop circuit is disclosed. The circuit includes a gated VCO which, when gated on, receives a digital signal that can start or stop its oscillation. When gated on, the VCO is able to generate a spread spectrum carrier by receiving a triangle wave signal that is self-generated by a delaying ramp generator when enclosed in a loop, where its ramp direction is controlled by a frequency comparator. The loop can be used to generate a spectrum spread as wide as possible above a known minimum frequency. The self-oscillating spread spectrum frequency control loop circuit produces a carrier signal whose spectrum is spread (bandwidth is increased). The circuit may be used within RF digital isolators, as RF digital isolators benefit from using spread spectrum carriers.

RF isolators that utilize low-pass filters in the transmitter and high-pass filters in the receiver, where the F-3 dB cutoff frequencies of both filters vary in a correlated manner, can be used together in a manner that does not produce spread spectrum frequencies below a minimum frequency. Die from a given wafer lot, when designed such that the low-pass and high-pass cutoff frequencies track, can be used in any combination to form RF digital isolators whose minimum spread spectrum frequency does not go below the minimum frequency for operation required by that wafer lot.

The term RF, short for Radio Frequency, as used herein, refers to any signal or wave propagating at a frequency in the radio spectrum, that is, anywhere from 3 kHz to 300 GHz. RF signals can be transmitted wirelessly or through wires.

Self-Oscillating Spread Spectrum Frequency Control Loop

Figure 1:
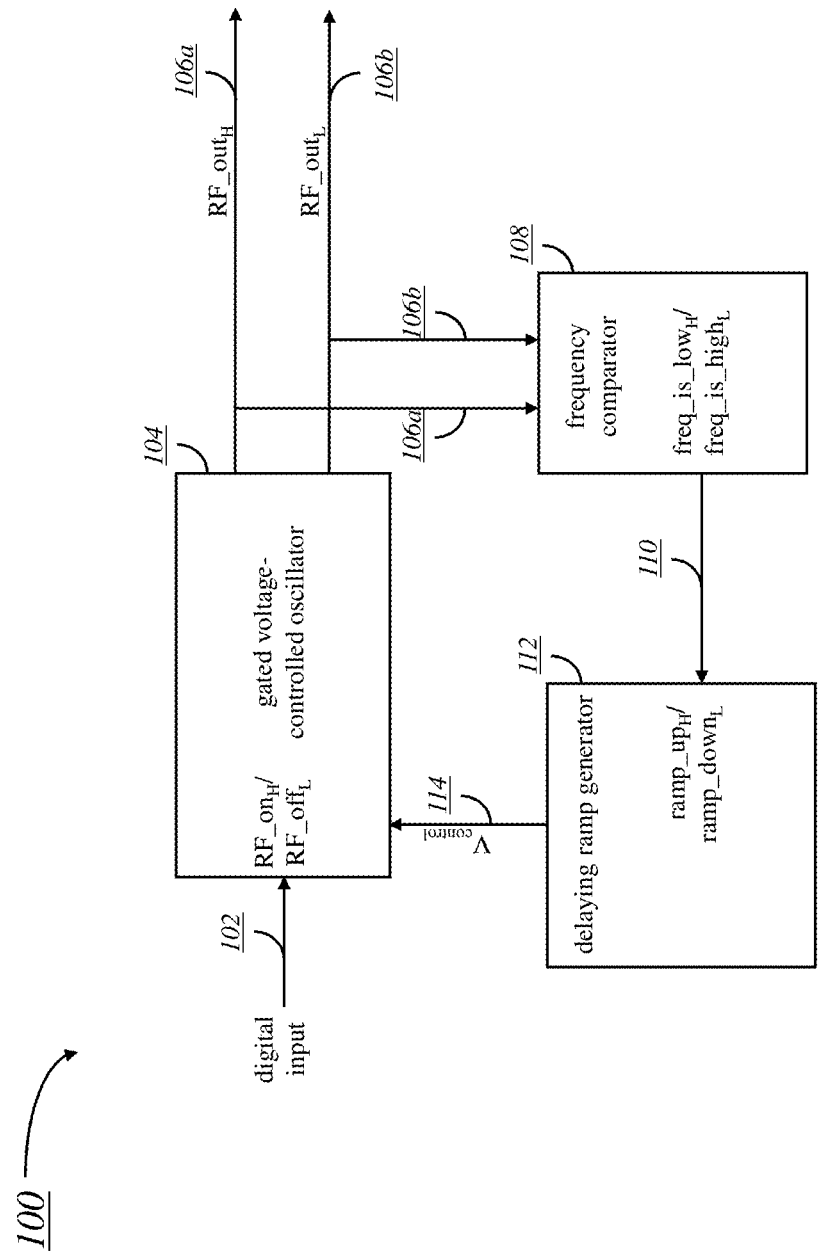
FIG. 1 is a diagram illustrating a self-oscillating spread spectrum frequency control loop circuit, in accordance with exemplary embodiments.

FIG. 1 is a representative drawing of a circuit 100 which generates a spread spectrum signal, according to exemplary embodiments. The circuit 100, known herein also as a self-oscillating spread spectrum frequency control loop 100, consists of a gated voltage-controlled oscillator (VCO) 104 which receives a digital input 102. The digital gate signal 102 is received into the gated VCO as one of two values, denoted RF_on$_H$ or RF_off$_L$.

VCOs are oscillators whose output can be varied over a range, as controlled by the control voltage, with the output frequency being directly related to the control voltage. VCOs may be designed to vary frequency only over a small range or over a very wide range. In one embodiment, useful for generating spread spectrum RF, the control voltage can vary the output frequency over a 1 to 1.8 range. By varying the control voltage, the output frequency of the signal produced by the VCO is adjusted. VCOs are used for a variety of applications, including frequency and phase modulation, and are also found in phased-locked loops. A gated VCO is a VCO that does not always turn on when power is applied but waits for a digital gate signal to be asserted before beginning to oscillate and ceases oscillating when the signal is de-asserted. In the gated VCO 104 of FIG. 1, the digital input has one of two values, denoted RF_on$_H$ and RF_off$_L$.

The gated VCO 104 generates differential signals 106$a$ and 106$b$ (collectively, "differential signal(s) 106"), which are denoted as RF_out$_H$ or RF_out$_L$, respectively. Differential signals are complementary signals in which the receiving circuit responds to the electrical difference between the two signals. The differential signals 106 are received into a frequency comparator 108. The frequency comparator 108 detects whether an input frequency is higher or lower than a predefined frequency, F$_{nominal}$. If the frequency is lower than the F$_{nominal}$ frequency, the output of the circuit is high, otherwise the output is low. In the circuit 100, based on a comparison of the difference between the differential signals 106 and the F$_{nominal}$ frequency, the frequency comparator 108 generates a digital signal 110, which may have one of two values, denoted freq_is_low$_H$ or freq_is_high$_L$.

In the circuit 100, the digital signal 110 from the frequency comparator 108 is received into a delaying ramp generator 112. A ramp generator is a circuit that creates a linear rising or falling output with respect to time. Ramp generators typically produce a sawtooth waveform. Another way to describe the delaying ramp generator 112 is as a black box integrator with an Up/Down switch controlled by the digital input (freq_is_low$_H$/freq_is_high$_L$) from the frequency comparator 108.

In exemplary embodiments, the delaying ramp generator 112 generates a triangle waveform, which is a particular type of sawtooth waveform in which the rise time is equal to the fall time. The ramp generator 112 of FIG. 1 is denoted a delaying ramp generator because the frequency of the triangle wave at V$_{control}$ is largely determined by the time delay between a change of level at 110 and the change in V$_{control}$ at 114. In other embodiments, the time required to ramp through any hysteresis within the frequency comparator adds to the loop 100 total delay. In the delaying ramp generator 112, one value of the digital input is denoted as ramp_up$_H$ and the other value denoted as ramp_down$_L$. The delaying ramp generator 112 generates a signal 114 received into the V$_{control}$ input of the gated VCO 104. In exemplary embodiments, the signal 114 is a triangle waveform. When V$_{control}$ 114 is ramped high the output frequency at RF outputs 106 is high and when V$_{control}$ is ramped low the output frequency at 106 is low. Thus the self-generated wave at V$_{control}$ serves to ramp the frequency at 106 up and down, thus spreading its spectrum.

In exemplary embodiments, the triangle wave-shaped V$_{control}$ received into the VCO 104 ramps the RF frequency above, then below the nominal frequency (F$_{nominal}$), where F$_{nominal}$ is set within the frequency comparator 108.

There are multiple uses for spread spectrum RF in communication. In addition to the radiated noise reduction described above, spread spectrum communications are very resistant to jamming and are harder to intercept than fixed carrier modulation systems. Thus, the spread spectrum loop disclosed herein can be used for other purposes in addition to within RF isolators.

The circuit 100 of FIG. 1 is thus a circuit used to generate spread spectrum RF upon command. In one embodiment, the circuit 100 is used with an RF-passing isolation barrier. In another embodiment, the circuit 100 is used with a circuit that detects on-off keying.

Figure 2:
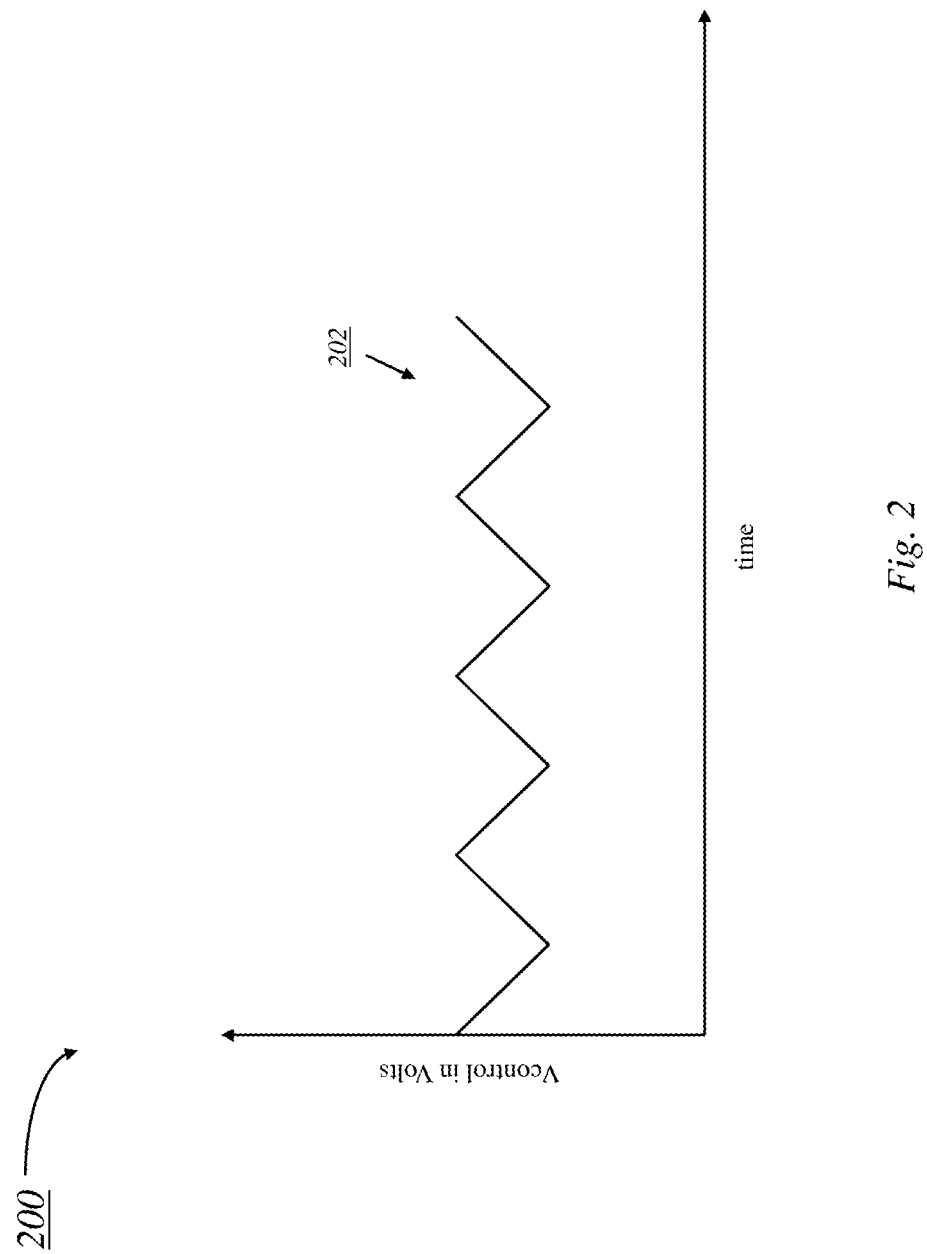
FIG. 2 is a diagram illustrating a triangle wave generated by the delaying ramp generator of the self-oscillating spread spectrum frequency control loop circuit of FIG. 1, in accordance with exemplary embodiments.

FIG. 2 is a graph 200 showing the signal 116 generated by the delaying ramp generator 112, according to exemplary embodiments. The graph plots time (x-axis) versus voltage (y-axis) at V$_{control}$ 114. Note that the frequency output of most VCOs is quite linear with V$_{control}$ voltage and if the y-axis was re-dimensioned as frequency, the graph would display the RF output 106 frequency vs time. The delaying ramp generator 112 generates an output signal 202 that may be described as a triangle wave. In some embodiments, by receiving the triangle wave signal 202, the gated VCO 104 is able to spread the bandwidth of the transmitted differential signal 106 to occupy the frequency spectrum available for transmission.

RF Isolation

The digital (RF) isolators described herein are concerned with unintended/unexpected occurrences of RF in an electronic circuit. As explained above, to comply with FCC limits on radiated RF emission, for the frequency band of 216 to 960 MHz, there should be no frequency with an RF field strength greater than 200 uV/meter when measured at a distance of 3 meters. Wiring within a system, whether PCB traces or cables, can form unintended antennas that cause excess radiated RF in the power, ground, and signal paths at either side of a digital isolator. Systems with a fixed frequency RF carrier can experience amplified emitted RF due to resonances of wiring and PCB traces at that frequency.

It is thus useful for an RF isolator to use a spread spectrum carrier signal which reduces emission at any one frequency. If the spectrum can be spread over a wide frequency band, this reduction will apply even when used with wiring that would have failed if a single-frequency carrier was used. Similarly, when used with well-designed wiring, the spread spectrum carrier will still reduce the emissions and influence other RF communications less, which is the purpose of the FCC limits. Spreading the spectrum over an increasingly wide bandwidth will continually reduce the emission at any one frequency. It is thus useful to use a spectrum spread as wide as possible. The self-oscillating spread spectrum frequency control loop 100 may thus be useful for RF isolation applications.

Figure 3:
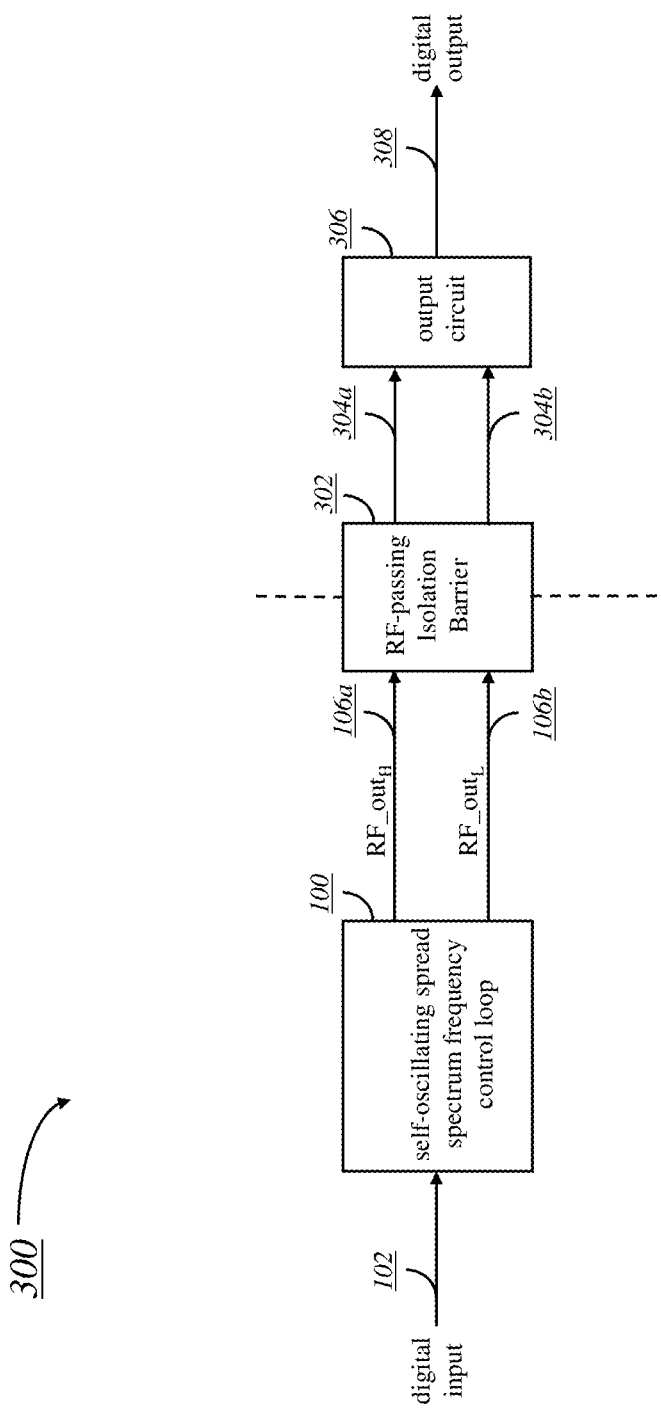
FIG. 3 is a diagram illustrating a self-oscillating spread spectrum frequency control loop circuit with an RF-pas sing isolator barrier, in accordance with exemplary embodiments.

FIG. 3 is a representative drawing of a circuit 300 which generates a spread spectrum carrier for an RF isolator, according to exemplary embodiments. The circuit 300 consists of the self-oscillating spread spectrum frequency control loop 100 of FIG. 1, which receives the digital input signal 102 and generates the complementary differential signals RF_out$_H$ 106$a$ and RF_out$_L$ 106$b$. The differential signals 106 are received into an RF-passing isolation barrier 302, which forms an isolation barrier between the input circuit 100 and an output circuit 306, which generates a digital output signal 308. The RF-passing isolation barrier 302 is designed to protect both the input circuit 100 and the output circuit 306 from large common mode voltage differences and transients. By using the circuit 100, the circuit 300 is able to generate a spread spectrum carrier for the RF-passing isolation barrier 302.

RF digital isolators are used to convey digital information across potentially catastrophic common mode voltages and common mode voltage changes. A logic signal is applied at the input and is duplicated at the output with respect to the ground of that circuit. RF digital isolators often use capacitors to implement the RF-passing isolation barrier between the input and output systems, although this is not required. Isolation capacitors may be formed from lead frame traces, may be formed within the package by vertically stacking dice over a dielectric, may be on-chip capacitors or may be externally implemented from PCB traces. Similarly, transformer RF-passing isolation may be implemented with on-chip or external components.

High- and Low-Pass Filters

High-pass filters are electronic circuits that pass signals with frequencies higher than the F-3 dB cutoff frequency, and attenuate signals (that is, makes the amplitude smaller) of frequencies lower than the cutoff frequency. Low-pass filters are electronic circuits that pass signals with frequencies lower than the F-3 dB cutoff frequency while attenuating signals with frequencies higher than the cutoff frequency.

It is opportune to design the first stage of an isolated receiver section of an RF digital isolator as a high pass filter. This presents particular characteristics that may enable optimization of the digital isolator and thus protect the entire circuit against larger common mode voltage differences and transients.

If, for example, a receiver coupling network is based upon a high pass filter, it is optimal to use the highest F-3 dB cutoff frequency possible as this will optimize the frequency range and the transient edge speed over which the system will reject common mode transients. The F-3 dB cutoff frequency of the high-pass filter is the frequency at which the amplitude of the incoming signal drops by 3 dB or 29%. A high pass filter greatly attenuates frequencies below the F-3 dB cutoff frequency and thus will help to reject any common mode transients at those lower frequencies.

While advanced processes may be able to generate synthetic inductors of suitable bandwidth and quality factor, cheaper larger geometry fabrication processes may not. It is thus useful to consider designs whose high-pass filter receiver coupling network is largely determined by passive resistor and capacitor values, known as an RC filter or RC high-pass filter. The F-3 dB cutoff frequency for an RC high-pass filter is based on the product of the resistor (R) and capacitor (C) values at each stage of the filter. Note that the disclosed spectrum spreading techniques do not require RC filters, any high-pass and low-pass filters can be used. But the use of the same type of resistors and capacitors in both the high-pass and low-pass filters does generate additional benefits as discussed below.

Figure 4:
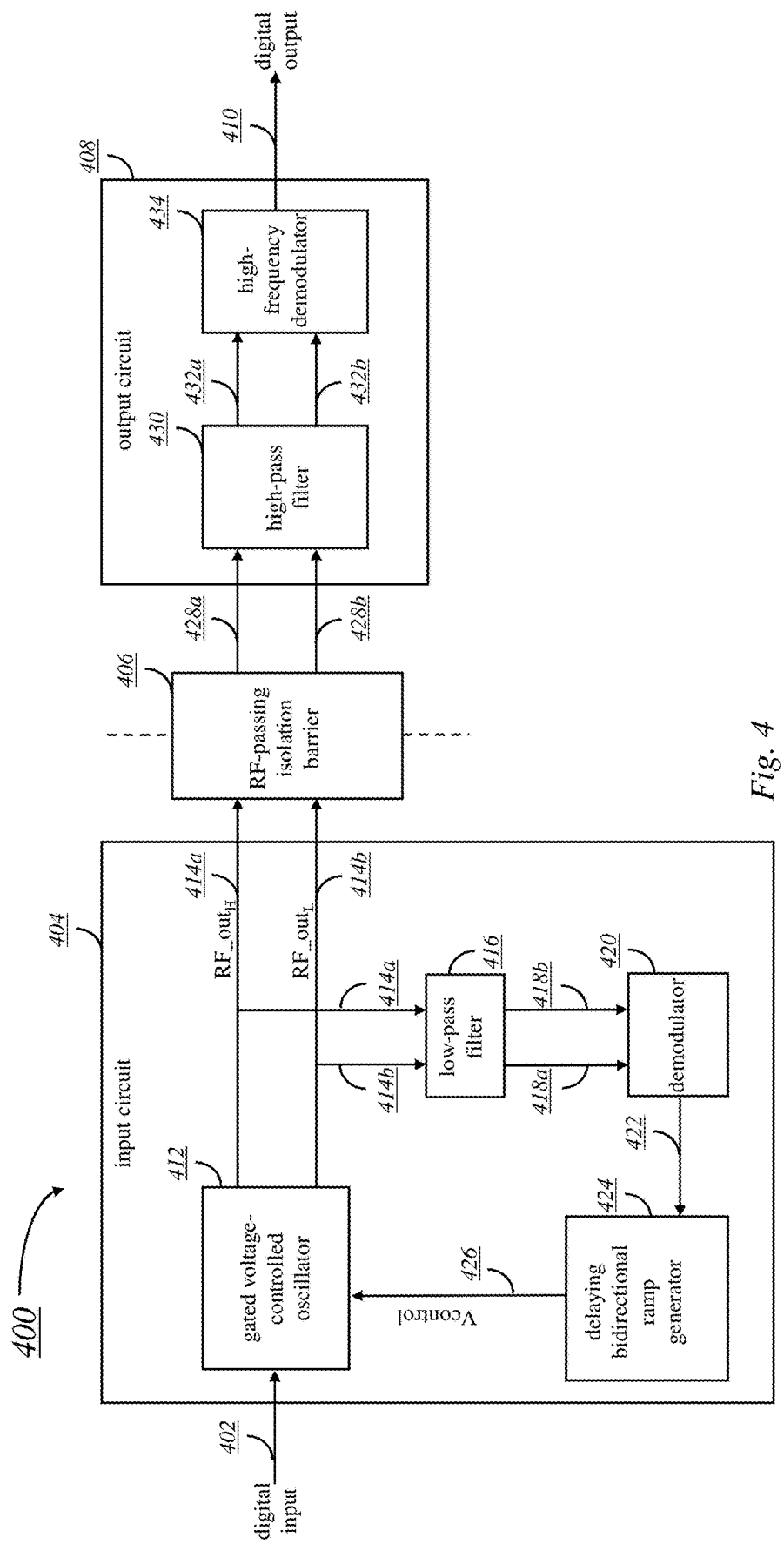
FIG. 4 is a diagram illustrating a self-oscillating spread spectrum frequency control loop circuit with an RF-passing isolation barrier, high- and low-pass filters, and a bidirectional integrator, in accordance with exemplary embodiments.

FIG. 4 is a representative drawing of a circuit 400 which generates a spread spectrum carrier for an RF isolator, according to exemplary embodiments. The circuit 400 consists of an input circuit 404 to receive a digital signal 402, an RF-passing isolation barrier 406, and an output circuit 408 to generate a digital output 410. The RF-passing isolation barrier 406 provides an isolation barrier between the input circuit 404 and the output circuit 408.

The input circuit 404 includes a low-pass filter 416 while the output circuit 408 includes a high-pass filter 430. Additionally, the input circuit 404 includes a gated VCO 412, a demodulator 420, and a bidirectional ramp generator 424 while the output circuit 408 further includes a high-frequency demodulator 434. As in the circuits 100 and 300, the gated VCO 410 generates complementary differential signals 414a and 414b (collectively, "differential signal(s) 414"), which are denoted as RF_out$_H$ or RF_out$_L$, respectively. The differential signals 414 are received by the low-pass filter 416, which allows signals of longer wavelengths (lower frequencies) to pass through while attenuating signals of shorter wavelengths (higher frequencies). From the low-pass filter 416, differential signals 418a and 418b (collectively, "differential signal(s) 418") are received into a demodulator 420. Demodulators are electronic circuits that recover the information content from a modulated carrier wave, where the modulated carrier wave is used to transmit the information, whether on a wire or wirelessly. The demodulator 420 receives the differential signals 418 and generates a single output signal 422. The output signal 422 is received into a bidirectional ramp generator 424, which generates a signal 426 to be received into the $V_{control}$ input of the gated VCO 412. In exemplary embodiments, the signal 426 is a triangle wave, such as is illustrated in FIG. 2.

At the output circuit 408, differential signals 428a and 428b (collectively, "differential signal(s) 428") from the RF-passing isolation barrier 406 are received into the high-pass filter 430, which allows signals of shorter wavelengths (higher frequencies) to pass through while attenuating signals of longer wavelengths (lower frequencies). From the high-pass filter 430, differential signals 432a and 432b (collectively, "differential signal(s) 432") are received into the high-frequency demodulator 434. The high-frequency demodulator 434, which separates the information from the carrier signal, receives the differential signals 432 and generates the single output signal 410.

The high-pass filter 430 at the isolated side of the RF-passing isolation barrier 406 (that is, the output circuit 408) sets the amount of common mode transient interference that the isolator will withstand without error. The higher the F-3 dB cutoff frequency of the high-pass filter 430, the higher the frequency and higher the slew rate (change of voltage or current) of the common mode transient that the RF-passing isolation barrier 406 can withstand without error. Thus, it is useful to design the RF-passing isolation barrier 406 to use as high a frequency as can be reliably generated. In exemplary embodiments, the high-pass filter 430 is a passive RC high-pass filter.

In one embodiment, the RF-passing isolation barrier 406 is constructed using capacitors. In a second embodiment, the RF-passing isolation barrier 406 is made using a transformer. The principles of creating a spread spectrum by the gated VCO may be achieved with many different RF isolator configurations.

A problem arises if the RF carrier signal (e.g., the differential signal 428), which can also be thought of as the spread spectrum, is of too low a frequency for the high-pass filter 430. In this case, the output of the high-pass filter will be of insufficient amplitude and the demodulated output 410 will not follow the applied digital input signal 402. Put another way, there will not be enough RF passed on to demodulate. An error will have occurred.

Unfortunately, most integrated circuit processes do not have available resistors whose resistance is well-controlled from one wafer lot to another. The absolute resistance of semiconductor resistors varies from wafer lot to wafer lot. Some foundries, for example, may allow the variance to be up to a 2:1 range. Integrated capacitors similarly have an allowed range which may be +/−15%. Thus, the F-3 dB cutoff frequency of an RC pair may vary by 2.3:1 from wafer lot to wafer lot.

While resistance can be laser trimmed or programmed with EPROM-controlled switches, a smaller and less expensive integrated circuit will result if a circuit can be designed that does not require trimming of any type.

In exemplary embodiments, the oscillator-side RC low-pass filter 416 of the input circuit 404, in cascade with the demodulator 420 is used to generate the digital pulse 422 received into the bidirectional ramp generator 424. In exemplary embodiments, the digital pulse 422 is high when the frequency at RF_out 414 is below a chosen reference frequency, $F_{ref}$.

In an exemplary embodiment, the low-pass filter 416 at the input circuit 404 tracks the high-pass filter 430 at the output circuit 408. That is, the F-3 dB cutoff frequencies of the high- and low-pass filters may vary but always vary together. In one embodiment, the $F_{cutoff}$ of low-pass filter 416 and high-pass filter 430 can be made to track by being fabricated from identical types of resistors and capacitors fabricated in the same wafer lot. The reference frequency, $F_{ref}$ is chosen to be above a minimum frequency required at the high-pass filter 430.

The bidirectional ramp generator 424 of the input circuit 404 is not further illustrated in FIG. 4. However, similar to the delaying ramp generator 112 of the circuit 100 (FIG. 1), the bidirectional ramp generator 424 receives a digital input signal and generates a triangle wave that is received into a gated VCO. As shown in FIG. 4, the digital input signal 422 is received from the demodulator 420 into the bidirectional ramp generator 424, which produces the analog signal 426 to be received into the $V_{control}$ input of the gated VCO 412. In exemplary embodiments, the analog signal 426 is a triangle wave similar to the one illustrated in FIG. 2.

In some embodiments, the input circuit 404, which may be a transmitter, and the output circuit 408, which may be a receiver, have a voltage supply of 3.3V. However, the common mode voltage between them may be thousands of volts. Or, more commonly, the common mode voltage could be zero volts, glitching up to thousands of volts. The RF-passing isolation barrier 406 is designed to keep these common mode voltages from damaging either circuit.

The design features of the circuit 400, namely, having a triangle wave feed into $V_{control}$ of the gated VCO and having a low-pass filter on the transmitter side (input circuit) of an RF isolator that tracks the high-pass filter at the receiver side (output circuit), the circuit 400 ensures that the transmitter does not make a frequency so low that the high-pass filter cannot see it. The low-pass filter matches the high-pass filter at the F-3 dB cutoff frequency and sets the lowest frequency that the VCO can go to, such that there is enough coming out of the high-pass filter so that the high-frequency demodulator at the output circuit is at the correct logic level.

Figure 5:
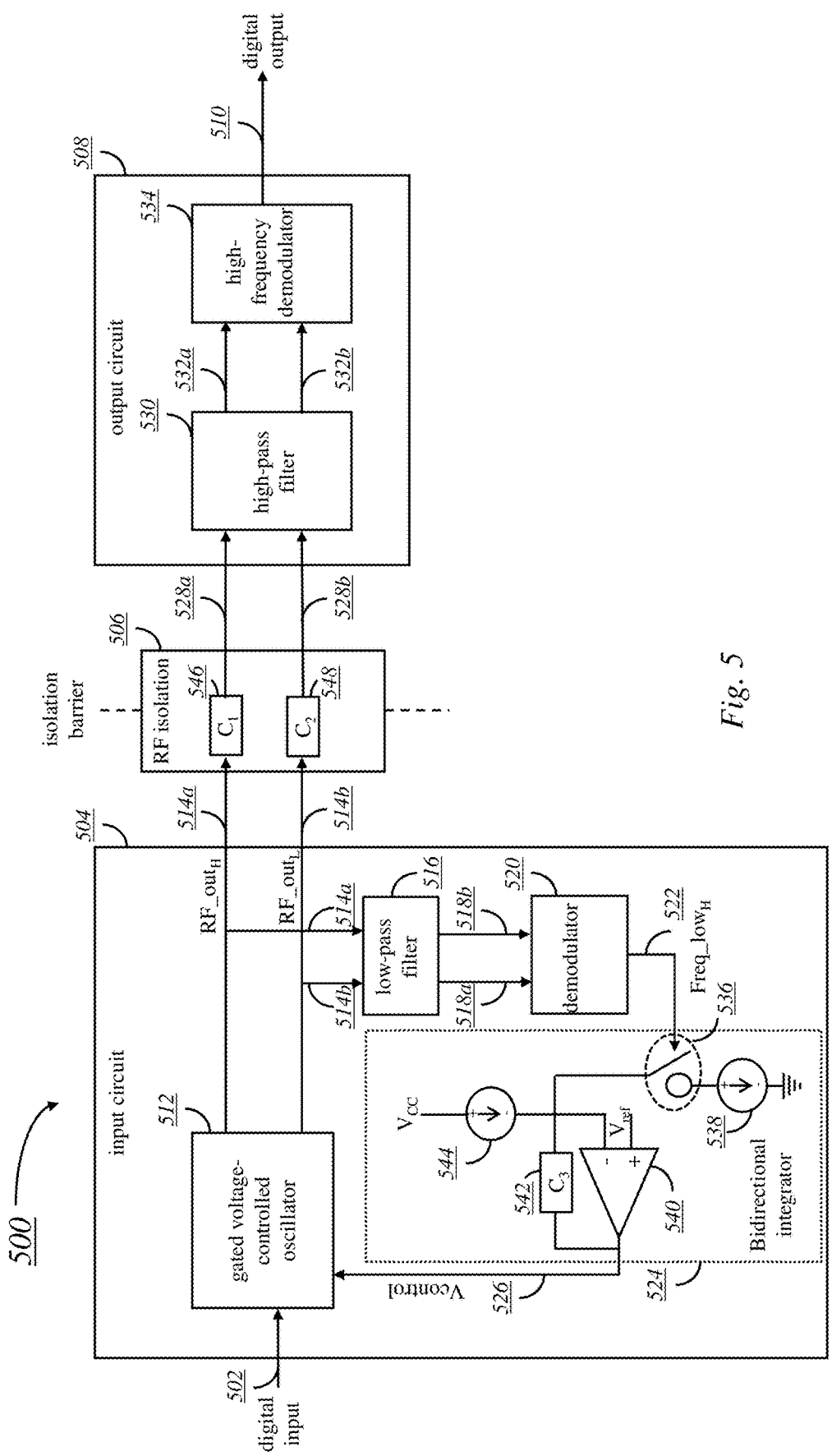
FIG. 5 is a diagram illustrating a self-oscillating spread spectrum frequency control loop circuit with an RF-passing isolation barrier, matching high- and low-pass filters, and a detailed illustration of a bidirectional integrator, in accordance with exemplary embodiments.

FIG. 5 is a representative drawing of a circuit 500 which generates a spread spectrum carrier for an RF isolator, according to exemplary embodiments. This circuit 500 provides an implementation of a bidirectional integrator 524. The bidirectional integrator consists of a single bit digital-to-analog converter at the input of an integrator, which integrator produces a triangle wave to be received into the $V_{control}$ input of a gated VCO. Further, the circuit 500 provides an implementation of an RF-passing isolation barrier that protects input and output circuits having low- and high-pass filters, respectively.

The circuit 500 consists of an input circuit 504 to receive a digital signal 502, an RF-passing isolation barrier 506, and an output circuit 508 to generate a digital output 510. The RF isolation barrier 506 between the input circuit 504 and the output circuit 508 must be designed to withstand all the possible common mode voltage difference between input 504 and output 508.

The input circuit 504 includes a low-pass filter 516 while the output circuit 508 includes a high-pass filter 530. Additionally, the input circuit 504 includes a gated VCO 512, a demodulator 520, and a bidirectional integrator 524 while the output circuit 508 further includes a high-frequency demodulator 534. Like the circuits 100, 300, and 400, the gated VCO 410 generates differential signals 514a and 514b (collectively, "differential signal(s) 514"), which are denoted as $RF\_out_H$ or $RF\_out_L$, respectively. In the input circuit 504, the differential signals 514 are received by the low-pass filter 516, which allows signals of longer wavelengths (lower frequencies) to pass through while attenuating signals of shorter wavelengths (higher frequencies). From the low-pass filter 516, differential signals 518a and 518b (collectively, "differential signal(s) 518") are received into a low-frequency demodulator 520. Further, the low-frequency demodulator 520 receives the differential signals 518 and generates a single output signal 522, shown also as $Freq\_low_H$. The output signal 522 is received at bidirectional integrator 524, which generates a signal 526 to be received into the $V_{control}$ input of the gated VCO 512. In exemplary embodiments, the signal 526 is a triangle wave, such as is illustrated in FIG. 2.

At the output circuit 508, differential signals 528a and 528b (collectively, "differential signal(s) 528") from the digital isolator 506 are received into the high-pass filter 530, which allows signals of shorter wavelengths (higher frequencies) to pass through while attenuating signals of longer wavelengths (lower frequencies). From the high-pass filter 530, differential signals 532a and 532b (collectively, "differential signal(s) 532") are received into the high-frequency demodulator 534. The high-frequency demodulator 534 receives the differential signals 532 and generates the single output signal 510.

The bidirectional integrator 524 includes a switch 537, a DC current source 538, an amplifier 540, a capacitor 542, and a second DC current source 544. The DC current source 544 attached to the switch 536 which controls DC current source 538 is a simple implementation of a 1-bit digital to analog converter. The output from the low-frequency demodulator 520 is the digital signal 522. The amplifier 540 combined with the capacitor 542 is an integrator. The signal 522 will be high if the frequency of the differential signal 518 is below some predetermined frequency and low if the frequency of the differential signal is above the predetermined frequency. The digital signal 522 controls the switch 536 within the bidirectional integrator 524.

In an exemplary embodiment, the cascade of low-pass filter 516 and demodulator 520 form a frequency comparator. The demodulated signal, $Freq\_low_H$, is applied to a bidirectional integrator 524 and its output is applied to the control voltage input, $V_{control}$, on the gated VCO 512. This results in a first order sigma delta idle pattern at $V_{control}$ 526. The differential implementation of the RF_out 514 and filters combined with the continuous modulation of the frequency above and below $F_{ref}$ greatly reduces electromagnetic interference. Under typical conditions the frequency modulation reduces peak electromagnetic interference (EMI) by 20 dB when measured on an analyzer with 1 MHz resolution bandwidth.

In exemplary embodiments, the amplifier with the capacitor as feedback in the bidirectional integrator 524 is configured as an integrator. In one embodiment, the capacitor is a 0.4 pF capacitor, the DC current source 544 is a 4 uA (DC) current source, and the DC current source 538 is an 8 uA (DC) current source. When the switch 536 is opened, the DC current source 544 "pushes" (sources) 4 uA of current into the negative input of the amplifier 540. That current causes the $V_{control}$ signal 526 to ramp in a negative direction at a rate given by dV/dt=(4 uA)/(0.4 pF)=−10V/us. However, when the switch 536 is closed, the second DC current source 538 tries to "pull" (sink) 8 uA of current from the negative terminal of the amplifier 540. The amplifier 540 gets 4 uA of that current from the DC current source 544. The other 4 uA thus must come through the capacitor 542. This forces the voltage at $V_{control}$ to ramp into a positive direction at +10V/us.

FIG. 5 thus illustrates a spread spectrum oscillator in the input circuit 504 whose minimum frequency is also determined by the RC product of the same type of resistor and capacitor used within the output circuit 508. When an input circuit 504 die from a particular wafer lot is paired with an output circuit 508 die from the same wafer lot, the input circuit die will keep the RF frequency above the minimum required for the values of R and C that were fabricated. Because the input circuit spectrum is held above the minimum frequency receivable, there will be no error. By identifying the minimum no error frequency within the transmitter, the spectrum can be spread as far as possible from there, thus reducing emissions further by spreading the spectrum further.

In exemplary embodiments, the circuit 500 includes an RF-pas sing isolation barrier 506 where the output circuit 508 coupling high-pass filter 530 F-3 dB cutoff frequency, $F_{cutoff}$, is largely determined by the RC product of high-resistance polysilicon resistors and metal-to-metal (MIM) capacitors. A buffered replica RF signal is generated on input circuit 504 chip and applied to the low-pass filter 516 of the input circuit 504 whose initial F-3 dB cutoff frequency is also determined by the RC product of high resistance poly resistors and MIM capacitors. The demodulator 520 converts the presence of RF at the low-pass output into a digital value (the signal 522, Freq_low$_H$). This digital value 522 is used to switch a reference current at an integrator configured within the bidirectional integrator 524.

In an exemplary embodiment, the frequency of the input circuit 504 is started at $V_{control}$ fully high (frequency of the gated VCO 512 at $F_{max}$). At this frequency, there is not enough RF at the low-pass filter 516 output (differential signals 518), so freq$_{LowH}$ will be low. The fixed reference current source 544 of 4 uA slowly ramps $V_{control}$ lower. Thus, the frequency of the gated VCO 512 decreases until there is enough RF at the low-pass filter 520 output to set Freq_low$_H$ high. At this point, the additional 8 uA of sunk reference current forces an equivalent 4 uA of current sink into the integration capacitor 542. This forces $V_{control}$ to start to go high which will increase the frequency at the output of the gated VCO 512.

Thus, if the F-3 dB cutoff frequency of the low-pass filter 516 is set by choosing RC values to just barely provide enough RF for the low-pass demodulator 522 to decode a logic high, this will set the frequency where the loop will always start to increase frequency. This must be done by measuring the loop using the expected value of $C_{integrate}$.

The highest frequency from the gated VCO 512 will be set by the time constants in the loop, dominated by $C_{integrate}$. Smaller $C_{integrate}$ will cause larger peak-to-peak triangle voltage swing at $V_{control}$ (more swing at $V_{control}$ causes wider spectrum spread) with a faster repetition frequency. Larger $C_{integrate}$ will cause a smaller peak-to-peak swing at a lower triangle frequency. For optimal spectrum spread $C_{integrate}$ should be chosen as small as possible without allowing $V_{control}$ to clip. If $V_{control}$ clips, the frequency stops changing while $V_{control}$ is clipped and the emissions become more correlated, thus losing the advantages of spreading the spectrum.

Sigma delta ADC loops will form a repetitive idle pattern when presented with a DC input. For a first order loop, the idle pattern is a triangle wave. This is because the integrator will integrate positive for 50% of the time and negative for 50%. The loop will keep a 50% duty cycle at Freq_low$_H$. The process of picking a F-3 dB cutoff frequency $F_{cutoff}$ with a given $C_{integrate}$ for a prescribed minimum frequency is identical to picking a higher frequency $F_{middle}$ around which an idle pattern of amplitude set by $C_{integrate}$ will change.

When the frequency initially gets low enough to set freq$_{LowH}$, the integration capacitor 542 had already been integrating for longer than a usual cycle. In fact, the integration capacitor 542 had integrated to exactly the voltage that is the lower voltage of the limit cycle that the loop will generate. That is why picking $F_{min}$ at a given $C_{integrate}$ is identical to picking a higher $F_{middle}$ which will have a deviation at $V_{control}$ of $V_{idle\_pattern}$ peak-to-peak.

While the RC products at the low-pass filter 516 and the high-pass filter 530 track each other, $C_{integrate}$ tracks only the capacitors used within these filters. Thus, the offset frequency from the 50% duty cycle (set by the peak swing at $V_{control}$) does not track the RC product. When capacitors are 15% higher in value, the gated VCO 512 theoretically could go as much as 15% lower in frequency. Because the integration cap is also 15% higher, $V_{control}$ goes 7.5% less negative and the gated VCO 512 doesn't go as slow as it would if $C_{integrate}$ hadn't changed. In practice, the difference in frequency is negligible, the gated VCO 512 minimum frequency changes from 546 MHz to 548 MHz, in one embodiment. Thus, the change in $C_{integrate}$ actually further prevents the gated VCO 512 from generating a too-low frequency.

If the capacitors are 15% lower in value, $V_{control}$ will swing 7.5% lower than it would have, which means the gated VCO frequency will be in error in an unsafe direction. In practice, this change is 5 MHz, from 569 MHz to 564 MHz, in some embodiments, which is not very significant. The 50% frequency of the loop, set by the RC values of the low-pass filter 516, are thus chosen to be just slightly higher in frequency than would have been necessary, in one embodiment.

Figure 6:
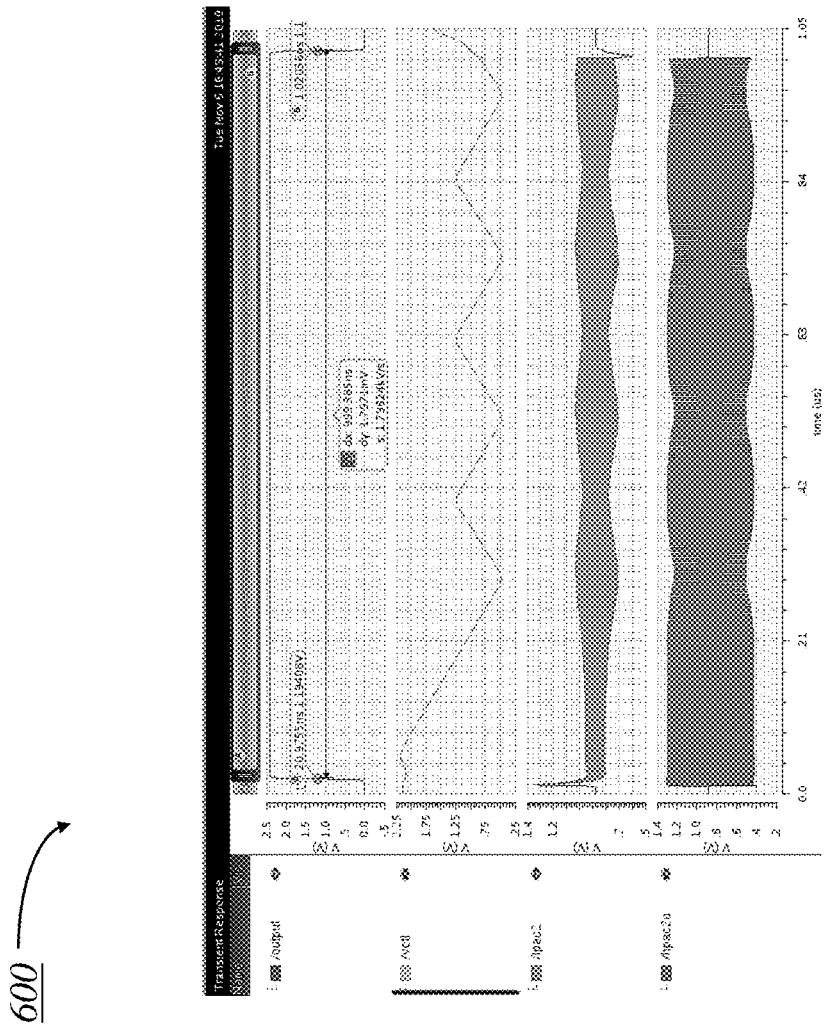
FIG. 6 is an oscilloscope output of a simulation result performed on the self-oscillating spread spectrum frequency control loop circuit of FIG. 5, in accordance with exemplary embodiments.

FIG. 6 shows simulation result using the circuit 500, in accordance with exemplary embodiments. The simulation result shows voltage over a 1.05 microsecond time period. A 1 us digital input pulse (not shown) is received into the circuit 500, and a 999.4 ns digital output pulse 602 is generated (at top). The $V_{control}$ input 604 to the gated VCO shows the triangle wave. In the first 30 ns, the spectrum is being spread twice as far as usual. A modulated low-pass filter output 606 and a modulated high-pass filter output 608 are also shown. The low-pass filter output 606 tracks the triangle wave 604. When the wave is low, the low-pass filter RF has a slightly bigger amplitude; when the wave is high, the low-pass filter RF has a smaller amplitude. Thus, the frequency that's being transmitted to the output circuit is controlled so that there won't be an error. The pulse width is distorted by less than 1 nanosecond, a result that is not easily obtained with an opto-isolator.

Figure 7:
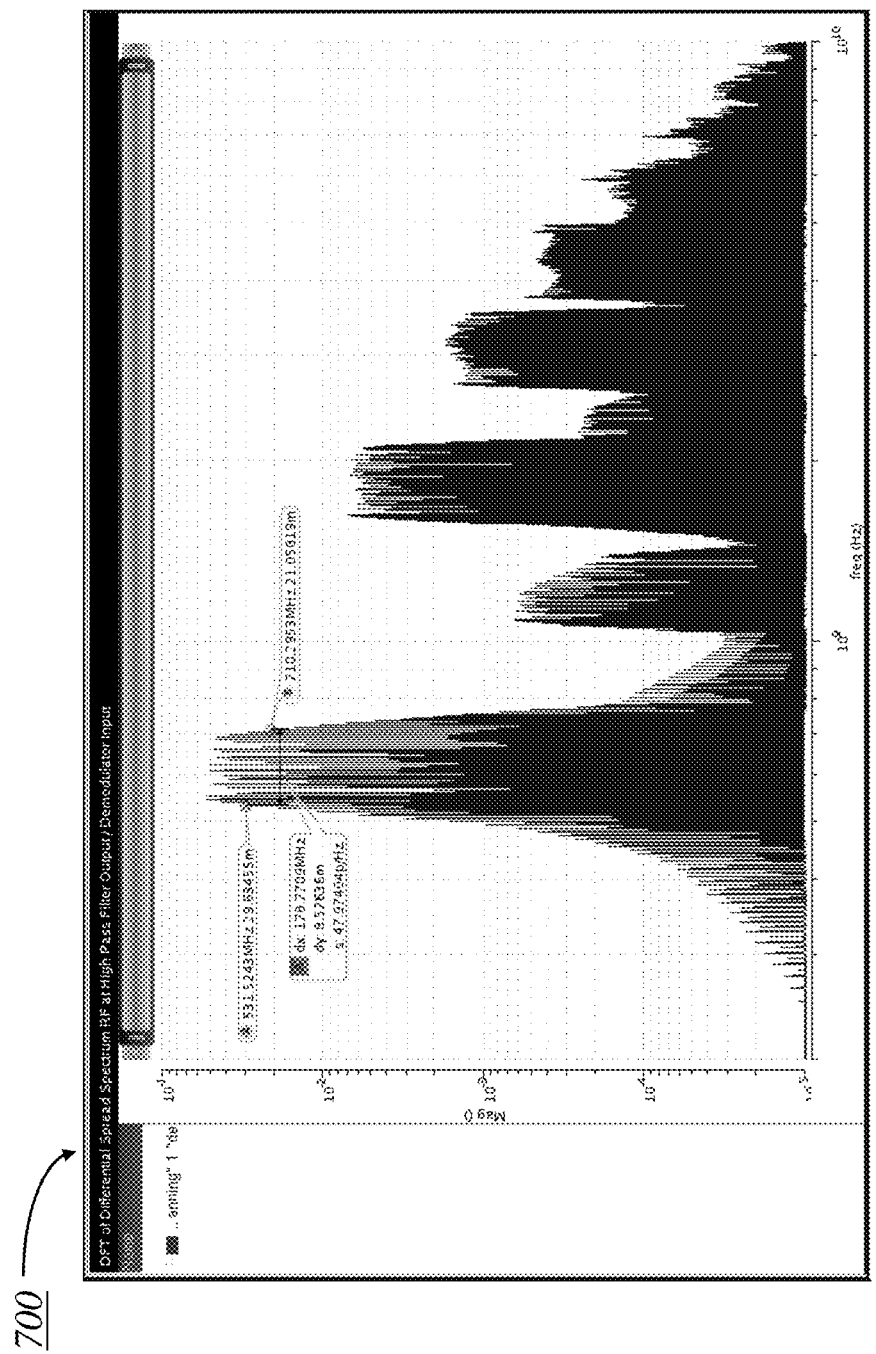
FIG. 7 is a Discrete Fourier Transform of differential spread spectrum RF at the high-pass filter output/demodulator input of the self-oscillating spread spectrum frequency control loop circuit of FIG. 5, in accordance with exemplary embodiments.

FIG. 7 is a diagram 700 showing a discrete Fourier transform (DFT) of the differential spread spectrum RF at the high-pass filter output and demodulator input (e.g., differential signals 532) of the circuit 500. Instead of a single line 10X taller at exactly 620 MHz the spectrum has been spread into 178 bins between 531 and 710 MHz. The second harmonics spread into 2 times 178 or 356 bins, the third harmonics spread into 3 times 178 or 534 bins and that pattern repeats for any higher harmonics present.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A circuit to generate a gated spread spectrum carrier signal, the circuit comprising:
   a gated voltage-controlled oscillator (VCO) to receive a digital input signal and generate the gated spread spectrum carrier signal when gated on;
   a low-pass filter to receive first and second differential signals from the gated VCO and generate low-pass filtered differential signals;
   a demodulator to receive the low-pass filtered differential signals and to convert a presence of RF above a known amplitude into a binary frequency compared digital signal; and
   a delaying bidirectional ramp generator to receive the binary frequency compared digital signal, the binary frequency compared digital signal to ramp in either a positive or a negative direction and to generate a sawtooth waveform, wherein the sawtooth waveform is received into a voltage control input of the gated VCO.

2. The circuit of claim 1, wherein the sawtooth waveform received into a $V_{control}$ input of the gated VCO is a triangle waveform of substantially equal positive and negative slew rate.

3. The circuit of claim 1, further comprising:
   a radio frequency-(RF) passing isolation barrier, wherein the gated spread spectrum carrier signal comprises a carrier to be transmitted across the RF-passing isolation barrier.

4. The circuit of claim 1, further comprising an output circuit comprising a high-pass filter to receive third and fourth differential signals from the RF-passing isolation barrier.

5. The circuit of claim 4, wherein the RF-passing isolation barrier disposed between the input circuit and the output circuit protects the input circuit and the output circuit from common mode voltage differences and transients.

6. The circuit of claim 1, wherein a low-pass filter F-3 dB cutoff frequency tracks a high-pass filter F-3 dB cutoff frequency.

7. The circuit of claim 1, wherein the sawtooth waveform is a triangle waveform of substantially equal positive and negative slew rate.

8. The circuit of claim 6, wherein the low-pass filter comprises a first set of one or more resistors and a first set of one or more capacitors.

9. The circuit of claim 8, wherein the high-pass filter comprises a second set of one or more resistors and a second set of one or more capacitors.

10. The circuit of claim 9, wherein the first set of one or more resistors are fabricated on a first die and the second set of one or more resistors of tracking value are fabricated on a second die, wherein the first die and the second die are fabricated on the same wafer lot.

11. The circuit of claim 9, wherein the first set of one or more capacitors are fabricated on a first die and the second set of one or more capacitors of tracking value are fabricated on a second die, wherein the first die and the second die are fabricated on the same wafer lot.

12. A system to generate a gated spread spectrum carrier signal in a radio frequency (RF) isolated circuit, the system comprising:
   a gated voltage-controlled oscillator (VCO) to receive a digital gate signal and, when gated on, to generate the gated spread spectrum carrier signal to be transmitted across an RF-passing isolation barrier;
   a demodulator to receive low-pass filtered differential signals and to convert a presence of RF above a known amplitude into a binary frequency compared digital signal;
   an integrator comprising an amplifier and a capacitor, wherein a first end of the capacitor is coupled to an output of the amplifier and a second end of the capacitor is coupled to an inverting input of the amplifier to form the integrator;
   a switch to be controlled by the binary frequency compared digital signal, the switch to control the inverting input of the integrator;
   wherein the inverting input is controlled by a switched input to form a bidirectional integrator.

13. The system of claim 12, wherein the switched input of the integrator comprises a digital-to-analog converter whose digital input is coupled to an output of the demodulator and whose analog output is applied to the inverting input.

14. The system of claim 13, wherein the RF-passing isolation barrier further comprises:
   a first capacitor with a first end coupled to the first differential signal and a second end coupled to the third differential signal; and
   a second capacitor with a third end coupled to the second differential signal and a fourth end coupled to the fourth differential signal.

15. The system of claim 14, further comprising an output circuit comprising a high-pass filter to receive the third and fourth differential signals from the RF-passing isolation barrier.

16. The system of claim 15, further comprising a low-pass filter to receive the first and second differential signals from the gated VCO and generate the low-pass filtered differential signals, wherein the gated VCO, the demodulator, and the low-pass filter are part of an input circuit.

17. The system of claim 16, wherein:
   the low-pass filter comprises a first set of one or more resistors and a first set of one or more capacitors;
   the high-pass filter comprises a second set of one or more resistors and a second set of one or more capacitors; and
   the first set of one or more resistors are fabricated on a first die and the second set of one or more resistors of tracking value are fabricated on a second die, wherein the first die and the second die are fabricated on the same wafer lot.

18. The system of claim 16, wherein:

the low-pass filter comprises a first set of one or more resistors and a first set of one or more capacitors;

the high-pass filter comprises a second set of one or more resistors and a second set of one or more capacitors; and the first set of one or more capacitors are fabricated on a first die and the second set of one or more capacitors of tracking value are fabricated on a second die, wherein the first die and the second die are fabricated on the same wafer lot.

19. The system of claim 12, further comprising a delaying bidirectional ramp generator to receive the binary frequency compared digital signal, the binary frequency compared digital signal to ramp in either a positive or a negative direction and to generate a sawtooth waveform to be received into a $V_{control}$ input of the gated VCO, wherein the sawtooth waveform is a triangle waveform of substantially equal positive and negative slew rate.

* * * * *